(12) United States Patent
Copeland (10) Patent No.: US 11,259,420 B1
(45) Date of Patent: Feb. 22, 2022

(54) PORTABLE RETRACTABLE DISPLAY SCREEN

(71) Applicant: Deena Copeland, Apollo Beach, FL (US)

(72) Inventor: Deena Copeland, Apollo Beach, FL (US)

( * ) Notice: Subject to any disclaimer, the term of this patent is extended or adjusted under 35 U.S.C. 154(b) by 120 days.

(21) Appl. No.: 16/820,841

(22) Filed: Mar. 17, 2020

(51) Int. Cl.
*H05K 5/00* (2006.01)
*H04N 5/64* (2006.01)
*G06F 1/16* (2006.01)
*H05K 5/02* (2006.01)

(52) U.S. Cl.
CPC ......... *H05K 5/0017* (2013.01); *G06F 1/1601* (2013.01); *H04N 5/64* (2013.01); *H05K 5/0217* (2013.01); *H05K 5/0234* (2013.01)

(58) Field of Classification Search
None
See application file for complete search history.

(56) References Cited

U.S. PATENT DOCUMENTS

| | | | |
|---|---|---|---|
| 8,526,109 B1 * | 9/2013 | Chen .................. | G03B 21/58 359/461 |
| 9,111,470 B2 | 8/2015 | Anderson | |
| 9,189,028 B2 | 11/2015 | Nakimov | |
| 9,618,975 B2 | 4/2017 | Su | |
| 10,140,947 B2 | 11/2018 | Song | |
| 10,448,531 B2 | 10/2019 | Chida | |
| 10,671,179 B2 * | 6/2020 | Xia .................. | G06F 1/1626 |
| 2007/0180745 A1 * | 8/2007 | Ofuji .................. | G09F 9/301 40/601 |
| 2010/0164837 A1 * | 7/2010 | Kao .................. | G06F 1/1652 345/1.3 |
| 2010/0258249 A1 * | 10/2010 | Kitada ............... | B29D 11/0074 156/510 |
| 2011/0018785 A1 * | 1/2011 | Aoki .................. | G06F 1/1641 345/1.3 |
| 2012/0002357 A1 * | 1/2012 | Auld .................. | G09F 11/30 361/679.01 |
| 2012/0306910 A1 * | 12/2012 | Kim .................. | H04N 13/30 345/619 |
| 2014/0268532 A1 | 9/2014 | Nicol | |
| 2016/0110152 A1 * | 4/2016 | Choi .................. | G06F 3/1423 345/2.3 |
| 2016/0170450 A1 * | 6/2016 | Kim .................. | G06F 1/1652 361/807 |
| 2016/0374228 A1 * | 12/2016 | Park .................. | H05K 7/16 |
| 2017/0060183 A1 | 4/2017 | Zhang | |
| 2018/0225804 A1 * | 8/2018 | Lu .................. | H05K 5/0017 |
| 2019/0174069 A1 * | 6/2019 | Poindexter, Jr. .... | G06F 3/04883 |
| 2020/0401231 A1 * | 12/2020 | Ahn .................. | G06F 3/0304 |

FOREIGN PATENT DOCUMENTS

WO      2014175296      10/2014

* cited by examiner

*Primary Examiner* — Xanthia C Cunningham
(74) *Attorney, Agent, or Firm* — Kyle A. Fletcher, Esq.

(57) ABSTRACT

The portable retractable display screen comprises a viewing screen, a controller, an enclosure, and at least one folding arm. The portable retractable display screen may be portably moved between venues when the viewing screen is stored within the enclosure. The viewing screen may be deployed from within the enclosure to present a vertical, flat display. The viewing screen may be operable to display an image sourced from a presentation device. As non-limiting examples, the presentation device may be a smart phone, a laptop, or a tablet computer.

18 Claims, 5 Drawing Sheets

PORTABLE RETRACTABLE DISPLAY SCREEN

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

Field of the Invention

The present invention relates to the fields of portable presentation devices and computer displays, more specifically, a portable retractable display screen.

SUMMARY OF INVENTION

The portable retractable display screen comprises a viewing screen, a controller, an enclosure, and at least one folding arm. The portable retractable display screen may be portably moved between venues when the viewing screen is stored within the enclosure. The viewing screen may be deployed from within the enclosure to present a vertical, flat display. The viewing screen may be operable to display an image sourced from a presentation device. As non-limiting examples, the presentation device may be a smart phone, a laptop, or a tablet computer.

An object of the invention is to provide a vertical, flat display screen for presenting one or more images sourced from a presentation device.

Another object of the invention is to provide flexible display screen that may be rolled and stored within an enclosure.

A further object of the invention is to provide a top cap supported by at lease one folding arm to hold the screen in a vertical orientation when the screen is deployed.

Yet another object of the invention is to provide a controller in wireless communication with the presentation device to receive images and a video controlled with video memory to format the images for display on the screen.

These together with additional objects, features and advantages of the portable retractable display screen will be readily apparent to those of ordinary skill in the art upon reading the following detailed description of the presently preferred, but nonetheless illustrative, embodiments when taken in conjunction with the accompanying drawings.

In this respect, before explaining the current embodiments of the portable retractable display screen in detail, it is to be understood that the portable retractable display screen is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the portable retractable display screen.

It is therefore important that the claims be regarded as including such equivalent construction insofar as they do not depart from the spirit and scope of the portable retractable display screen. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of the appended claims.

DETAILED DESCRIPTION OF THE EMBODIMENT

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description. As used herein, the word "or" is intended to be inclusive.

Detailed reference will now be made to a first potential embodiment of the disclosure, which is illustrated in FIGS. 1 through 5.

The portable retractable display screen 100 (hereinafter invention) comprises a viewing screen 200, a controller 210, an enclosure 230, and at least one folding arm 260. The invention 100 may be portably moved between venues when the viewing screen 200 is stored within the enclosure 230. The viewing screen 200 may be deployed from within the enclosure 230 to present a vertical, flat display. The viewing screen 200 may be operable to display an image sourced from a presentation device 900. As non-limiting examples, the presentation device 900 may be a smart phone, a laptop, or a tablet computer.

The viewing screen 200 may be a flexible active display that may be rolled. The viewing screen 200 may be rolled to a diameter that is larger than a roller diameter 246 and smaller than an interior height 250 of a base 232 of the enclosure 230. When rolled, the viewing screen 200 may be stored within the base 232 of the enclosure 230. When unrolled, the viewing screen 200 may be stretched into a vertically-oriented plane that extends between the base 232 of the enclosure 230 and a top cap 244 of the enclosure 230. The top of the viewing screen 200 may be coupled to the top cap 244. The bottom of the viewing screen 200 may be coupled to a roller 238. As non-limiting examples, the viewing screen 200 may be an organic LED display, an organic LCD display, or combinations thereof.

The controller 210 may be operable to power and update the contents of the viewing screen 200. The controller 210 may comprise a wireless transceiver 212, a video memory 216, a video controller 218, and a power supply 220. The controller 210 may be in wireless communication with the presentation device 900 via the wireless transceiver 212.

The wireless transceiver 212 may be electrically coupled to the video controller 218. The wireless transceiver 212 may be operable to exchange message between the video controller 218 and the presentation device 900 via a wireless signal 224. In some embodiments, the wireless transceiver 212 may be a Bluetooth transceiver.

The video memory 216 may store a representation of the image that is to be displayed. As non-limiting examples, the video memory 216 may hold one or more text mode or bitmap images. A text mode image may comprise characters (such as ASCII character) which may be stored in the video memory 216, may be read from the video memory 216 by the video controller 218, and may be translated by the video controller 218 into pixels displayed on the viewing screen 200. In some embodiments, the video memory 216 may comprise attributes such as color and/or brightness levels associated with the characters. A bitmap image may comprise a pixel map of the contents of the viewing screen 200 such that changing the contents of a location of the video memory 216 causes a change to a corresponding pixel on the viewing screen 200.

The video controller 218 may write the contents of the video memory 216 responsive to the messages received from the presentation device 900 such that the image displayed on the viewing screen 200 may be changed. The video controller 218 may read from the video memory 216 and may convert the contents read from the video memory 216 into video control signals. The video control signals may be electrically coupled to the viewing screen 200 such that the viewing screen 200 may display the image stored in the video memory 216.

The power supply 220 may condition electrical power received from a power cord 222 into one or more voltages that may be used by the video controller 218, the video memory 216, the wireless transceiver 212 and the viewing screen 200. As a non-limiting example, the power supply 220 may condition 110 volt AC from the power cord 222 into one or more DC voltages within the range of 3.3 volts to 24 volts.

The enclosure 230 may comprise the base 232 and the top cap 244. The enclosure 230 may house the video controller 218, the video memory 216, the wireless transceiver 212, and the power supply 220. The enclosure 230 may house the roller 238 around which the viewing screen 200 is stored.

The base 232 may comprise a hollow interior 234, a screen slot 236, the roller 238, and an arm cavity 242. The base 232 may be placed upon a horizontal surface 920 in preparation for deploying the viewing screen 200. The screen slot 236 may be an aperture through which the viewing screen 200 may pass. The screen slot 236 may be located on the top surface of the base 232 and may be oriented longitudinally on the base 232. The screen slot 236 may be longer in a longitudinal direction than the width of the viewing screen 200. The screen slot 236 may be wider in a front-to-back direction that the thickness of the viewing screen 200.

The roller 238 may be a longitudinally-oriented cylinder. The roller 238 may be mounted within the hollow interior 234 such that the roller 238 may spin around the longitudinal axis of the roller 238. The bottom of the viewing screen 200 may be coupled to the roller 238. The roller 238 may comprise a spring 240 that may be operable to rotate the roller 238 in a first rotational direction 290 in the absence of an extending force 294. Rotation of the roller 238 in the first rotational direction 290 may pull the viewing screen 200 into the base 232 and may wrap the viewing screen 200 around the roller 238. The extending force 294 applied to the viewing screen 200 via the top cap 244 may pull the viewing screen 200 from the base 232 and may cause the roller 238 to rotate in a second rotational direction 292.

The arm cavity 242 may be a depression within the top of the base 232. The at least one folding arm 260 may stow into the arm cavity 242 when the top cap 244 is lowered to the base 232 and the viewing screen 200 is wrapped around the roller 238.

The top cap 244 may be a support for the top of the viewing screen 200. The top cap 244 may rest upon the top of the base 232 when the viewing screen 200 is not deployed. The top cap 244 may be the same length and width as the base 232. The top of the viewing screen 200 may couple to a screen anchor 248 located within the top cap 244.

The at least one folding arm 260 may support the top cap 244 in an elevated position when the viewing screen 200 is deployed. The at least one folding arm 260 may pivotably couple to the top cap 244 at the top of the at least one folding arm 260 and may pivotably couple to the base 232 at the bottom of the at least one folding arm 260. Tension placed upon the roller 238 by the spring 240 may stretch the viewing screen 200 between the top cap 244 and the base 232 to retain the viewing screen 200 in a vertical plane when deployed.

The at least one folding arm 260 may comprise an upper armature 262, a lower armature 264, an arm hinge 266, a lower arm hinge 268, and an upper arm hinge 270. The upper armature 262 may pivotably couple to the lower armature 264 via the arm hinge 266. The bottom of the lower armature 264 may be pivotably coupled to the base 232 via the lower arm hinge 268. The top of the upper armature 262 may be pivotably coupled to the top cap 244 via the upper arm hinge 270. The at least one folding arm 260 may fold such that the upper armature 262 is adjacent the lower armature 264 when the viewing screen 200 is not deployed. The at least one folding arm 260 may extend vertically to support the top cap 244 when the viewing screen 200 is deployed. In some embodiments, the at least one folding arm 260 may lock in the extended orientation by moving into an over-center lock position 274. In the over-center lock position 274, the at least one folding arm 260 may pivot from folded to linearly extended and may then continue to pivot until the arm hinge 266 has moved beyond a straight line drawn from the upper arm hinge 270 to the lower arm hinge 268. The geometry of the at least one folding arm 260 may prevent the at least one folding arm 260 from continuing to pivot beyond the over-center lock position 274. In order to retract the viewing screen 200, the top cap 244 must be lifted and the at least one folding arm 260 may pivot in the opposite direction such that the at least one folding arm 260 is linear again. Continued pivoting in the opposite direction may then permit the viewing screen 200 to retract into the base 232.

In some embodiments, the base 232 may comprise a plurality of feet 282. The plurality of feet 282 may prevent the base 232 from scratching the horizontal surface 920 upon which the base 232 rests. As a non-limiting example, the plurality of feet 282 may be made from natural or synthetic rubber, felt, cork, plastic, or another cushioning material.

A single folding arm is illustrated in the drawings, however those skilled in the art will recognize that the at least one folding arm 260 may comprise two or more arms that cooperatively lift the top cap 244. As a non-limiting example, a first folding arm may be located on the right side of the base 232 and a second folding arm may be located on the left side of the base 232. In some embodiments, the first folding arm and the second folding arm may bend in opposite directions. The first folding arm and the second folding arm may fold into the same arm cavity for storage or may fold into separate arm cavities.

Figure 1:
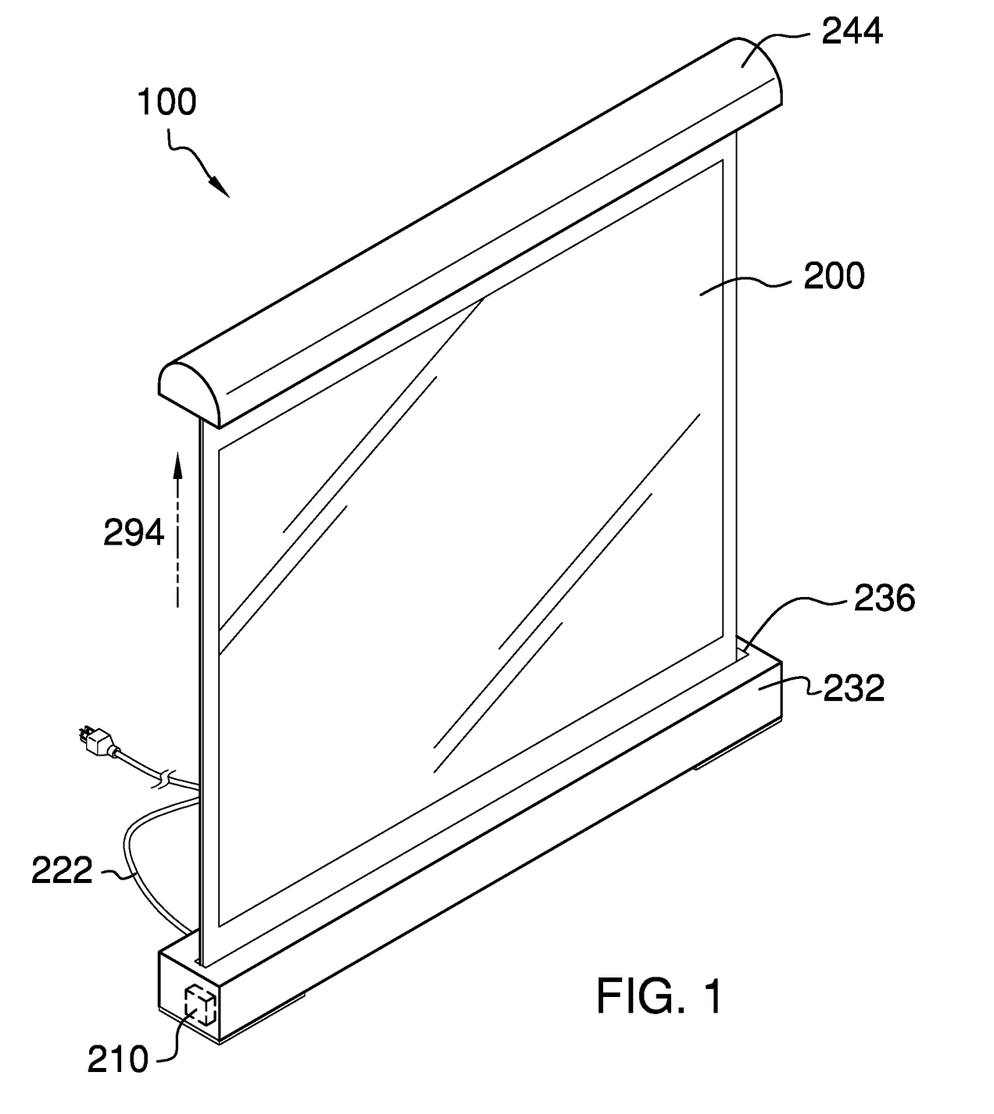
FIG. 1 is an isometric view of an embodiment of the disclosure illustrating the screen deployed to the vertical orientation.
Figure 2:
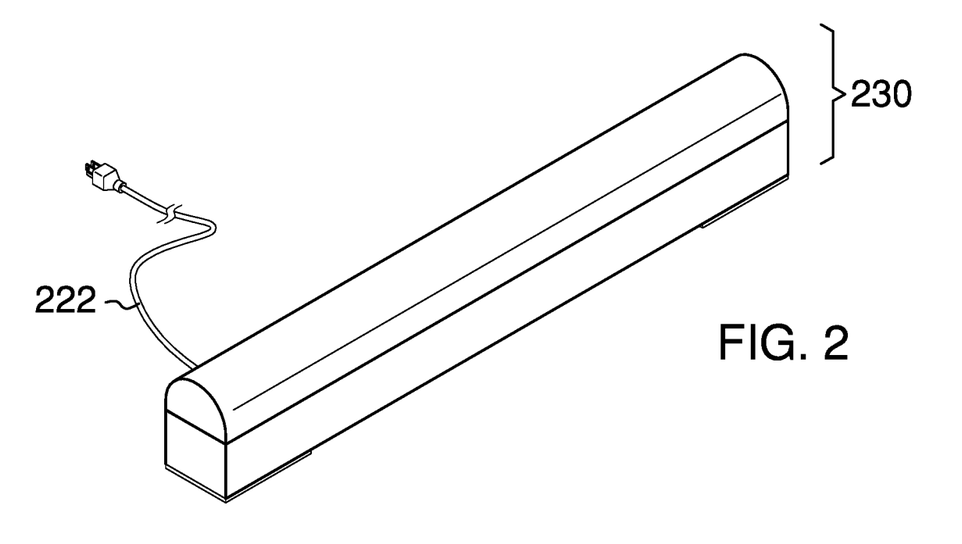
FIG. 2 is an isometric view of an embodiment of the disclosure illustrating the screen stored within the enclosure.
Figure 3:
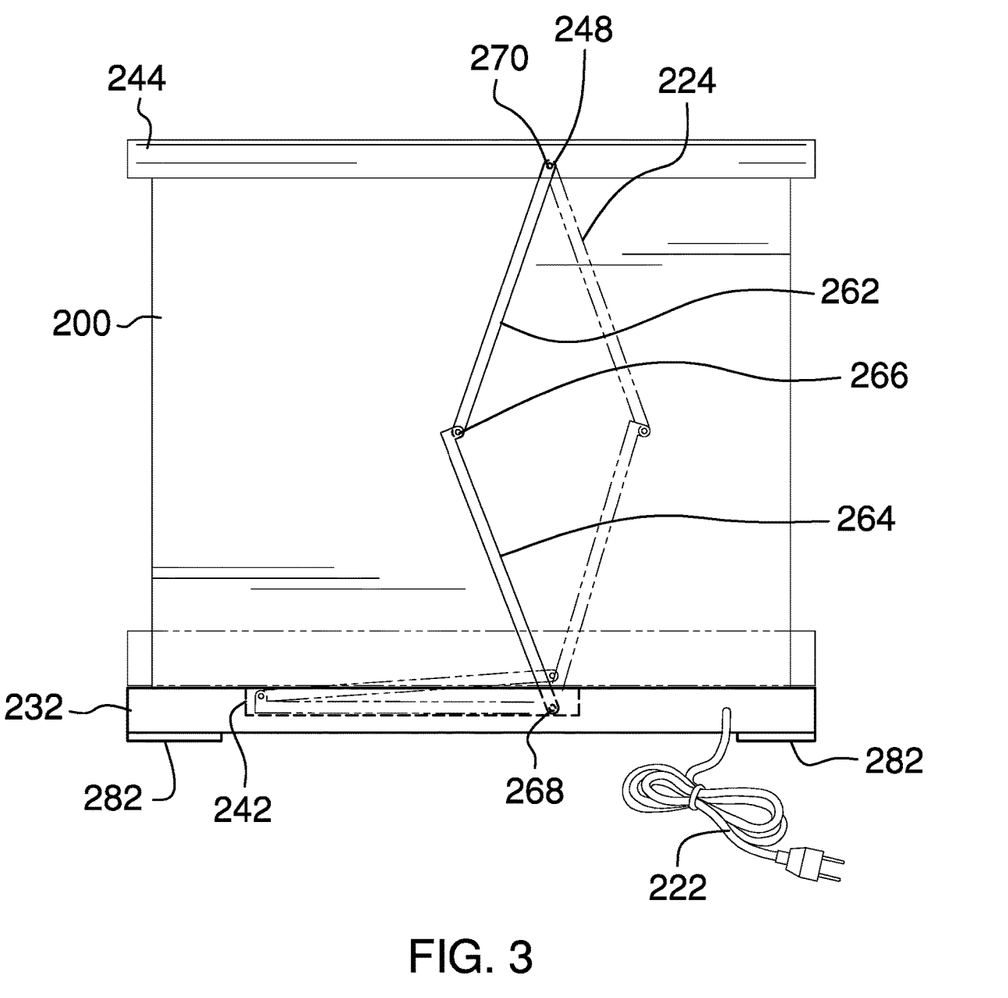
FIG. 3 is a rear view of an embodiment of the disclosure illustrating the screen deployed.
Figure 4:
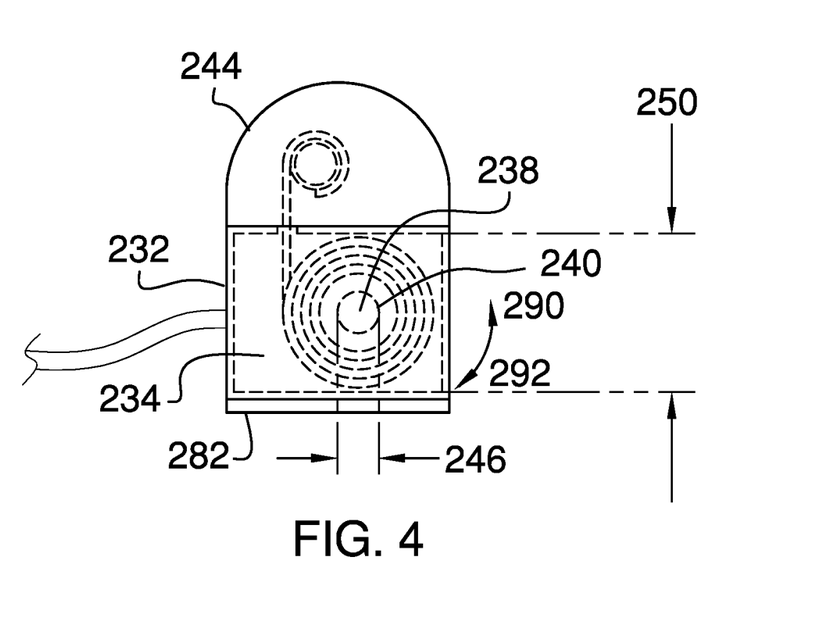
FIG. 4 is a side of an embodiment of the disclosure illustrating the screen rolled and stored within the enclosure.
Figure 5:
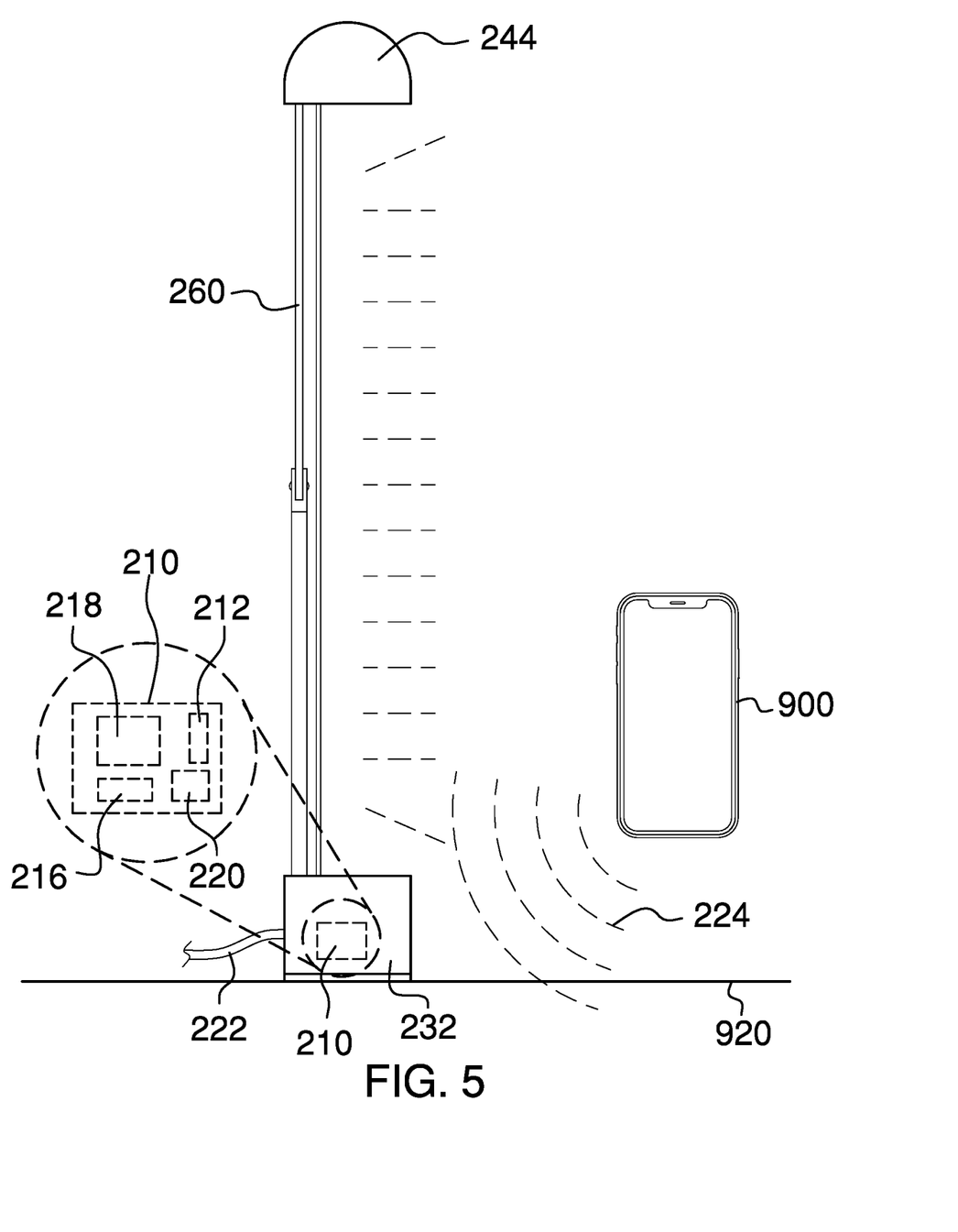
FIG. 5 is an in-use side view of an embodiment of the disclosure illustrating the screen deployed and a presentation device communicating with the controller.

In use, a presenter may place a base 232 upon a horizontal surface 920 and deploy a viewing screen 200 by raising a top cap 244. At least one folding arm 260 may retain the top cap 244 in an elevated position such that the viewing screen 200 is deployed as a vertically-oriented plane. A power cord 222 may be plugged into a wall outlet to power the invention 100. A presentation device 900 may pair with a wireless transceiver 212 in the base 232 and may transmit an image to a video controller 218 via the wireless transceiver 212. The video controller 218 may transform the image from the contents of a video memory 216 into video control signals that may be operable to display the image on the viewing screen 200. When no longer needed, the at least one folding arm 260 may be folded into the base 232 and the top cap 244 may be lowered such that the viewing screen 200 wraps around a roller 238 within the base 232.

DEFINITIONS

Unless otherwise stated, the words "up", "down", "top", "bottom", "upper", and "lower" should be interpreted within a gravitational framework. "Down" is the direction that gravity would pull an object. "Up" is the opposite of "down". "Bottom" is the part of an object that is down farther than any other part of the object. "Top" is the part of an object that is up farther than any other part of the object. "Upper" refers to top and "lower" refers to the bottom. As a non-limiting example, the upper end of a vertical shaft is the top end of the vertical shaft.

As used in this disclosure, "AC" is an acronym for alternating current.

As used in this disclosure, an "anchor" is a device that holds an object in place. When used as a verb, "anchor" refers to holding an object firmly or securely.

As used in this disclosure, an "aperture" is an opening in a surface. Aperture may be synonymous with hole, slit, crack, gap, slot, or opening.

As used in this disclosure, "Bluetooth" is a standardized communication protocol that is used to wirelessly interconnect electronic devices. Bluetooth® is a registered trademark of Bluetooth SIG.

As used in this disclosure, a "cavity" is an empty space or negative space that is formed within an object.

As used in this disclosure, the word "correspond" indicates that a first object is in some manner linked to a second object in a one to one relationship or that one or more properties shared by two or more objects match, agree, or align within acceptable manufacturing tolerances.

As used herein, the words "couple", "couples", "coupled" or "coupling", may refer to connecting, either directly or indirectly, and does not necessarily imply a mechanical connection.

As used in this disclosure, "DC" is an acronym for direct current.

As used in this disclosure, a "diameter" of an object is a straight line segment that passes through the center (or center axis) of an object. The line segment of the diameter is terminated at the perimeter or boundary of the object through which the line segment of the diameter runs.

As used in this disclosure, "flexible" refers to an object or material which will deform when a force is applied to it, which will not return to its original shape when the deforming force is removed, and which may not retain the deformed shape caused by the deforming force.

As used herein, "front" may indicate the side of an object that is closest to a forward direction of travel under normal use of the object or the side or part of an object that normally presents itself to view or that is normally used first. "Rear" or "back" may refer to the side that is opposite the front.

As used in this disclosure, a "hinge" is a device that permits the turning, rotating, or pivoting of a first object relative to a second object.

As used in this disclosure, "horizontal" is a directional term that refers to a direction that is perpendicular to the local force of gravity. Unless specifically noted in this disclosure, the horizontal direction is always perpendicular to the vertical direction.

As used in this disclosure, the word "interior" is used as a relational term that implies that an object is located or contained within the boundary of a structure or a space.

As used herein, the word "longitudinal" or "longitudinally" refers to a lengthwise or longest direction.

As used in this disclosure, "orientation" refers to the positioning and/or angular alignment of a first object relative to a second object or relative to a reference position or reference direction.

As used herein, "pair", "paired", and "pairing" refer to a connection established between two wireless devices or to the process of establishing such a connection.

As used herein, the word "pivot" is intended to include any mechanical arrangement that allows for rotational motion. Non-limiting examples of pivots may include hinges, holes, posts, dowels, pins, points, rods, shafts, balls, and sockets, either individually or in combination.

As used herein, the word "portable" refers to a device that may be carried by a single person and may be used at multiple locations. In some cases, portable may imply that the device may be used while being carried.

As used in this disclosure, a "spring" is a device that is used to store mechanical energy. This mechanical energy will often be stored by deforming an elastomeric material that is used to make the device, by the application of a torque to a rigid structure, or by a combination thereof. In some embodiments, the rigid structure to which torque is applied may be composed of metal or plastic.

As used herein, a "tablet computer" or "tablet" refers to a mobile computing device packaged as a single, monolithic unit —similar in appearance to a paper tablet. Typically, tablet computers have a touch sensitive, flat video display covering most of the front surface and do not have a keyboard; although many tablet computers may be mated with a separate keyboard accessory. Tablet computers generally comprise one or more microprocessors, memory, and a rechargeable battery internal to the tablet. Most tablet computers comprise a wireless network connection, typically via a WiFi interface. Many tablet computers comprise an internal camera, microphone, and one or more audio speakers. Interaction between the user and a tablet computer is generally via the touch screen using a stylus or fingers and may involve the use of 'gestures' which are specific motions on the touch screen which are interpreted by the tablet computer to magnify or shrink the display, open, close, or switch between applications, scroll, or perform other tablet computer functions.

As used in this disclosure, a "transceiver" is a device that is used to transmit and/or receive signals. The signals may be audible, optical, or RF in nature.

As used in this disclosure, "vertical" refers to a direction that is parallel to the local force of gravity. Unless specifically noted in this disclosure, the vertical direction is always perpendicular to horizontal.

As used in this disclosure, "wireless" is an adjective that is used to describe a communication channel that does not require the use of physical cabling.

With respect to the above description, it is to be realized that the optimum dimensional relationship for the various components of the invention described above and in FIGS. 1 through 5, include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

The inventor claims:

1. A portable retractable display screen comprising:
a viewing screen, a controller, an enclosure, and at least one folding arm;
wherein the viewing screen is stored within the enclosure when not in use;
wherein the viewing screen is deployed from within the enclosure to present a vertical, flat display;
wherein the viewing screen is operable to display an image sourced from a presentation device;
wherein the viewing screen is a flexible active display that is rolled;
wherein the viewing screen is rolled to a diameter that is larger than a roller diameter and smaller than an interior height of a base of the enclosure;
wherein when rolled, the viewing screen is stored within the base of the enclosure;
wherein when unrolled, the viewing screen is stretched into a vertically-oriented plane that extends between the base of the enclosure and a top cap of the enclosure;
wherein the top of the viewing screen is coupled to the top cap;
wherein the bottom of the viewing screen is coupled to a roller.

2. The portable retractable display screen according to claim 1
wherein the viewing screen is an organic LED display, an organic LCD display, or combinations thereof.

3. The portable retractable display screen according to claim 1
wherein the controller is operable to power and update the contents of the viewing screen;
wherein the controller comprises a wireless transceiver, a video memory, a video controller, and a power supply;
wherein the controller is in wireless communication with the presentation device via the wireless transceiver.

4. The portable retractable display screen according to claim 3
wherein the wireless transceiver is electrically coupled to the video controller;
wherein the wireless transceiver is operable to exchange message between the video controller and the presentation device via a wireless signal.

5. The portable retractable display screen according to claim 4
wherein the wireless transceiver is a Bluetooth transceiver.

6. The portable retractable display screen according to claim 4
wherein the video memory stores a representation of the image that is to be displayed.

7. The portable retractable display screen according to claim 6
wherein the video controller writes the contents of the video memory responsive to the messages received from the presentation device such that the image displayed on the viewing screen is changed;
wherein the video controller reads from the video memory and converts the contents read from the video memory into video control signals;
wherein the video control signals is electrically coupled to the viewing screen such that the viewing screen displays the image stored in the video memory.

8. The portable retractable display screen according to claim 7
wherein the power supply conditions electrical power received from a power cord into one or more voltages that are used by the video controller, the video memory, the wireless transceiver and the viewing screen.

9. The portable retractable display screen according to claim 8
wherein the enclosure comprises the base and the top cap;
wherein the enclosure houses the video controller, the video memory, the wireless transceiver, and the power supply;
wherein the enclosure houses the roller around which the viewing screen is stored.

10. The portable retractable display screen according to claim 9
wherein the base comprises a hollow interior, a screen slot, the roller, and an arm cavity;
wherein the base is placed upon a horizontal surface in preparation for deploying the viewing screen.

11. The portable retractable display screen according to claim 10
wherein the screen slot is an aperture through which the viewing screen passes;
wherein the screen slot is located on the top surface of the base and is oriented longitudinally on the base;
wherein the screen slot is longer in a longitudinal direction than the width of the viewing screen;
wherein the screen slot is wider in a front-to-back direction that the thickness of the viewing screen.

12. The portable retractable display screen according to claim 11 wherein the roller is a longitudinally-oriented cylinder;

wherein the roller is mounted within the hollow interior such that the roller spins around the longitudinal axis of the roller;

wherein the bottom of the viewing screen is coupled to the roller;

wherein the roller comprises a spring that is operable to rotate the roller in a first rotational direction in the absence of an extending force;

wherein rotation of the roller in the first rotational direction pulls the viewing screen into the base and wraps the viewing screen around the roller;

wherein the extending force applied to the viewing screen via the top cap pulls the viewing screen from the base and causes the roller to rotate in a second rotational direction.

13. The portable retractable display screen according to claim 12 wherein the arm cavity is a depression within the top of the base;

wherein the at least one folding arm stows into the arm cavity when the top cap is lowered to the base and the viewing screen is wrapped around the roller.

14. The portable retractable display screen according to claim 13 wherein the top cap is a support for the top of the viewing screen;

wherein the top cap rests upon the top of the base when the viewing screen is not deployed;

wherein the top cap is the same length and width as the base;

wherein the top of the viewing screen couples to a screen anchor located within the top cap.

15. The portable retractable display screen according to claim 14 wherein the at least one folding arm supports the top cap in an elevated position when the viewing screen is deployed;

wherein the at least one folding arm pivotably couples to the top cap at the top of the at least one folding arm and pivotably couples to the base at the bottom of the at least one folding arm;

wherein tension placed upon the roller by the spring stretches the viewing screen between the top cap and the base to retain the viewing screen in a vertical plane when deployed.

16. The portable retractable display screen according to claim 15 wherein the at least one folding arm comprises an upper armature, a lower armature, an arm hinge, a lower arm hinge, and an upper arm hinge;

wherein the upper armature pivotably couples to the lower armature via the arm hinge;

wherein the bottom of the lower armature is pivotably coupled to the base via the lower arm hinge;

wherein the top of the upper armature is pivotably coupled to the top cap via the upper arm hinge;

wherein the at least one folding arm folds such that the upper armature is adjacent the lower armature when the viewing screen is not deployed;

wherein the at least one folding arm extends vertically to support the top cap when the viewing screen is deployed.

17. The portable retractable display screen according to claim 16 wherein the at least one folding arm locks in the extended orientation by moving into an over-center lock position.

18. The portable retractable display screen according to claim 16 wherein the base comprises a plurality of feet;

wherein the plurality of feet prevent the base from scratching the horizontal surface upon which the base rests.

* * * * *